(12) United States Patent
Mostarshed et al.

(10) Patent No.: US 7,511,517 B2
(45) Date of Patent: Mar. 31, 2009

(54) SEMI-AUTOMATIC MULTIPLEXING SYSTEM FOR AUTOMATED SEMICONDUCTOR WAFER TESTING

(75) Inventors: Shahriar Mostarshed, San Mateo, CA (US); Michael L. Anderson, San Jose, CA (US)

(73) Assignee: QualiTau, Inc., Sunnyvale, CA (US)

( * ) Notice: Subject to any disclaimer, the term of this patent is extended or adjusted under 35 U.S.C. 154(b) by 139 days.

(21) Appl. No.: 11/270,371

(22) Filed: Nov. 8, 2005

(65) Prior Publication Data

US 2007/0103176 A1    May 10, 2007

(51) Int. Cl.
   *G01R 31/02* (2006.01)
(52) U.S. Cl. ...................................... 324/754
(58) Field of Classification Search ............. 324/754, 324/761–762, 765, 158.1, 763; 439/41, 476.1; 397/330, 332; 257/48; 438/14, 17, 18
   See application file for complete search history.

(56) References Cited

U.S. PATENT DOCUMENTS 5,818,248 A * 10/1998 St. Onge .................... 324/761
5,945,838 A * 8/1999 Gallagher et al. ........... 324/761
6,414,502 B1 * 7/2002 Sayre et al. ................. 324/755
6,541,791 B2 * 4/2003 Chang ......................... 257/48

OTHER PUBLICATIONS

International Search Report in corresponding PCT application PCT/US06/43148, mailed Apr. 23, 2008.
Written Opinion in corresponding PCT application PCT/US06/43148, mailed Apr. 23, 2008.

* cited by examiner

*Primary Examiner*—Ha Tran T Nguyen
*Assistant Examiner*—Tung X Nguyen
(74) *Attorney, Agent, or Firm*—Beyer Law Group LLP

(57) ABSTRACT

A semi-automatic multiplexing system for automated semiconductor wafer testing employs a jumper block for each device type in the semiconductor wafer to be tested, each jumper block having inputs for receiving a test input/output line, a plurality of block contacts corresponding to pads of a device to be tested, and manually set connectors or jumper cables for selectively interconnecting jumper block inputs to block contacts. A multiplexer is then used for selectively connecting tester input/output lines to the jumper blocks, thereby reducing the number of relays required for connecting test signals to the devices in the semiconductor wafer.

8 Claims, 5 Drawing Sheets

SEMI-AUTOMATIC MULTIPLEXING SYSTEM FOR AUTOMATED SEMICONDUCTOR WAFER TESTING

BACKGROUND OF THE INVENTION

This invention relates generally to the testing of semiconductor integrated circuits (ICs) and devices, and more particularly the invention relates to the multiplexing of test signals to a wafer prober for selectively testing by different devices.

In the electrical probing and measuring of electrical parameters of integrated circuits and devices in semiconductor wafers, a probe card with multiple pins facilitates concurrent access to a large number of circuit contacts in one or more devices in the wafer. Typically one or more probe cards are spaced from the wafer so that "massively parallel" measurements can be made on a single wafer.

In all automated parametric testing of semiconductor devices there is a need to collect large amounts of data from devices on wafers using a minimum set of expensive parametric test equipment to share amongst large numbers of devices. This can be achieved by switching or multiplexing the parametric test equipment output amongst device inputs across the whole wafer, one at a time. Typically this can be achieved by an external multiplexer which requires a bundle of cables to connect to a probe card on an automatic wafer prober, or by a multiplexer that can reside right on top of the probe card on the wafer prober, and which makes contact with a probe card through pogo pins. The disadvantage of the external multiplexer, aside form the high cost of the multiplexer and the added cost of the large number of cables needed to route the signals to a distribution head on top of the wafer prober, is added cable length, which makes the system prone to noise pickup. In addition this cabling scheme introduces stray capacitance into the system, which can damage the components under test. Multiplexing the signals on top of the probe card with traditional multiplexing is very similar in cost to the use of an external multiplexer in that a large number of relays and switches are used, in the construction of the multiplexer, which increases expense.

This is illustrated in FIG. 1 where a parametric tester 10 has N source lines 12 connected through a pin multiplexer 14 which selects pins of a wafer prober 16 to receive the N source lines. Typically the pin selection will vary for different devices (i.e., circuit layouts) in a semiconductor wafer under control of computer 18.

SUMMARY OF THE INVENTION

In accordance with the invention, the multiplexing requirements in parametric testing of different devices or circuit layouts in a semiconductor wafer are reduced by using manually programmable jumper blocks for probe contact selection for the different devices.

The invention utilizes the fact that device configurations do not need to be dynamically changed but are fixed for each device for the duration of multiple lists. Only tester source lines needs to be multiplexed among different devices on the wafer.

The invention and objects and features thereof will be more readily apparent from the following detailed description and appended claims when taken with the drawings.

DETAILED DESCRIPTION OF ILLUSTRATIVE EMBODIMENTS

In almost all wafer level parametric testing each device layout is a constant across all die of a wafer, layouts may be different for different devices on the same die, but the layouts are still fixed across the entire wafer, so the need to change the settings or to "multiplex" those connections is minimal. These configuration settings may at worst be needed for every batch of wafers and at best be a constant for a whole production line. Therefore, the routing of signals can be achieved by manual means for each device because it remains unchanged across a wafer and for as many wafers as are needed to test in that product generation. Hence, the problem reduces to a need to multiplex the sources needed for testing these devices. Traditionally, multiplexers have used grid arrays of switches and relays, up to a number equal to N multiplied by M where N is the number of signals from the source equipment to be multiplexed and M is the number of pins on the probe card or the number of pads on the die connected to devices. For instance if there are 48 pads on the die and there is a need to multiplex four sources amongst them, then there needs to be 4×48=192 relays, each with three contacts, in the system (the factor 3 stems from the fact that each signal line set can include a force, a sense, and a guard signal).

Figure 1:
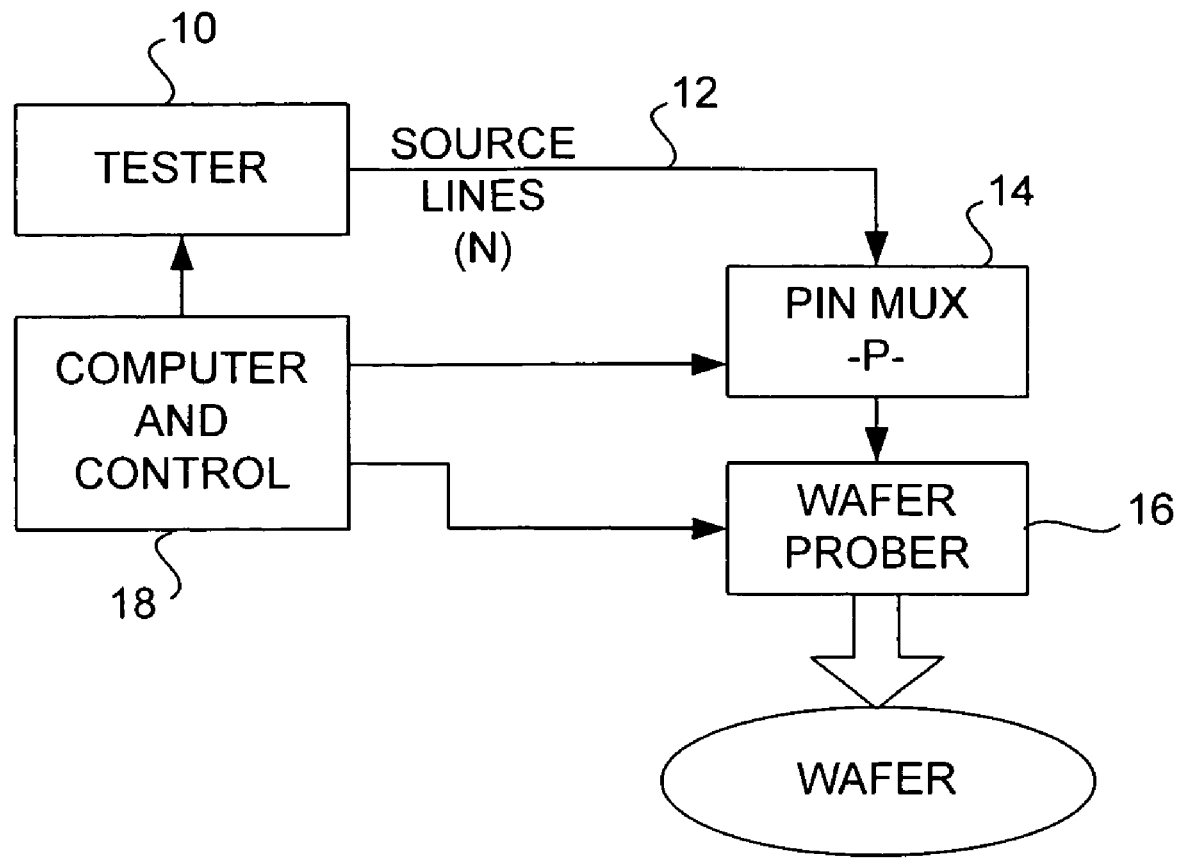
FIG. 1 is a functional block diagram of a multiplexed test system in accordance with prior art.
Figure 2:
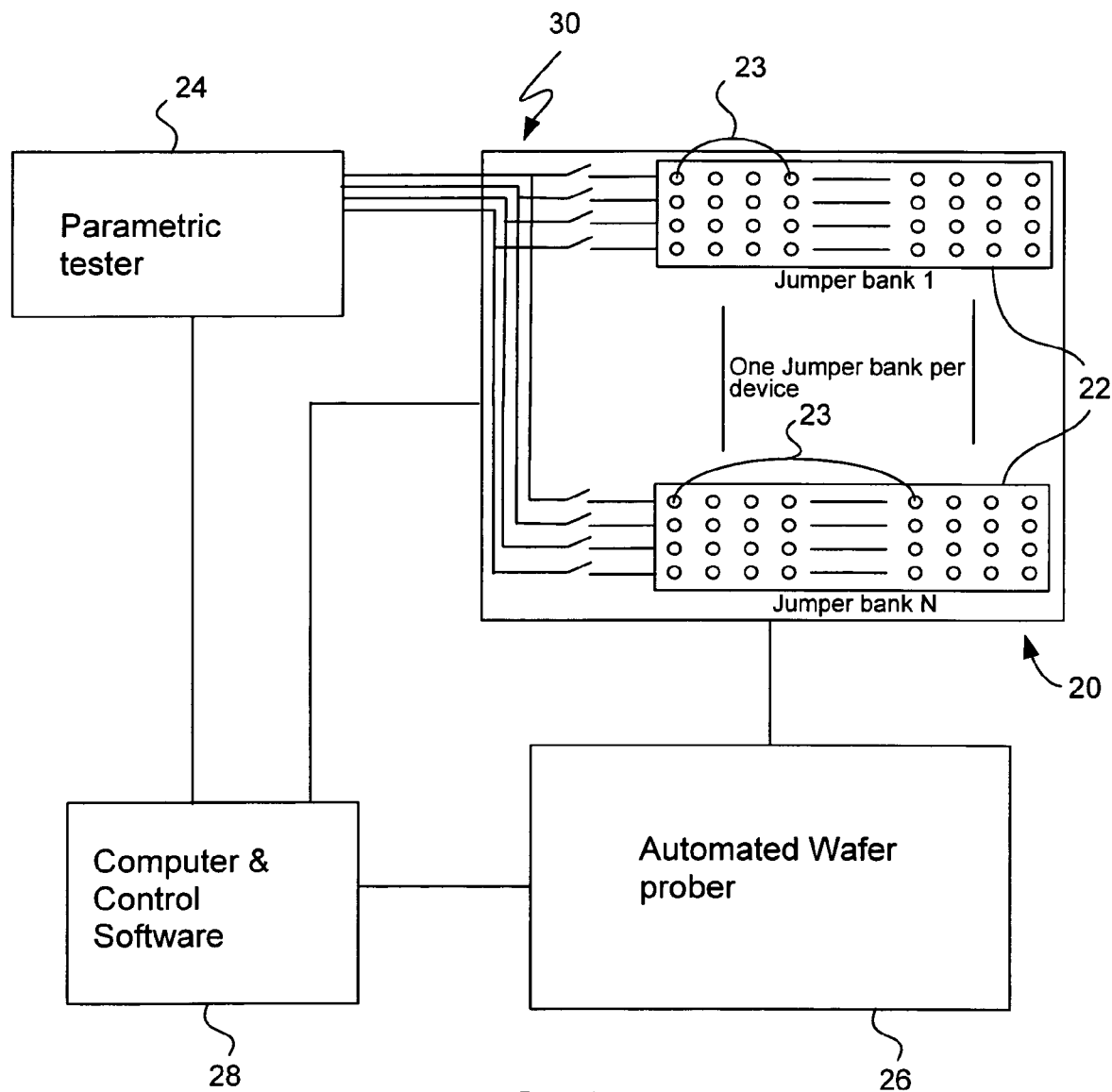
FIG. 2 is a functional block diagram of a multiplexed test system in accordance with one embodiment of the invention.

FIG. 2 is a functional block diagram of one embodiment of a multiplexed test system in accordance with the invention in which parametric tester 24 is selectively connected through jumper blocks 22 to a wafer prober 26 for testing various circuit devices under control of computer 28. Here a multiplexer 30 connects tester sources to a distribution board 20 which has fixed banks of header connectors or jumper blocks 22 for all devices. Since most, if not all, parametric testing of semiconductor devices involves a maximum of four terminals from a parametric tester 24, each jumper block may be limited to four inputs (although the jumpers can be arranged in groups of 6 or more for space and organizational advantages), but are not be limited to four and could be customizable per application. The low cost of production of the jumper block boards makes it possible to produce them for each application. This implies that the user will install jumper blocks on the appropriate headers, with four sets of jumper cables 23 per device, and for as many different devices as are on the die. With the devices so configured, the sources have to be multiplexed amongst them. This makes the number of relays limited to the number of sources multiplied by the number of sets of jumpers or the number of devices on each die, with each source having three contacts for a set of three functions: Force, Sense, Guard. Multiplexing a four source system into 12 four terminal devices requires only 48 relays and not 4×48 relays, as would be the case in the conventional multiplexers as noted above. The jumpers need to be set for each device pattern (on each bank) once, and only changed if the pad assignment for the device is changed across different technology platforms. In this very simple way the cost of the multiplexer will undergo a significant decrease, while not compromising performance.

Figure 3:
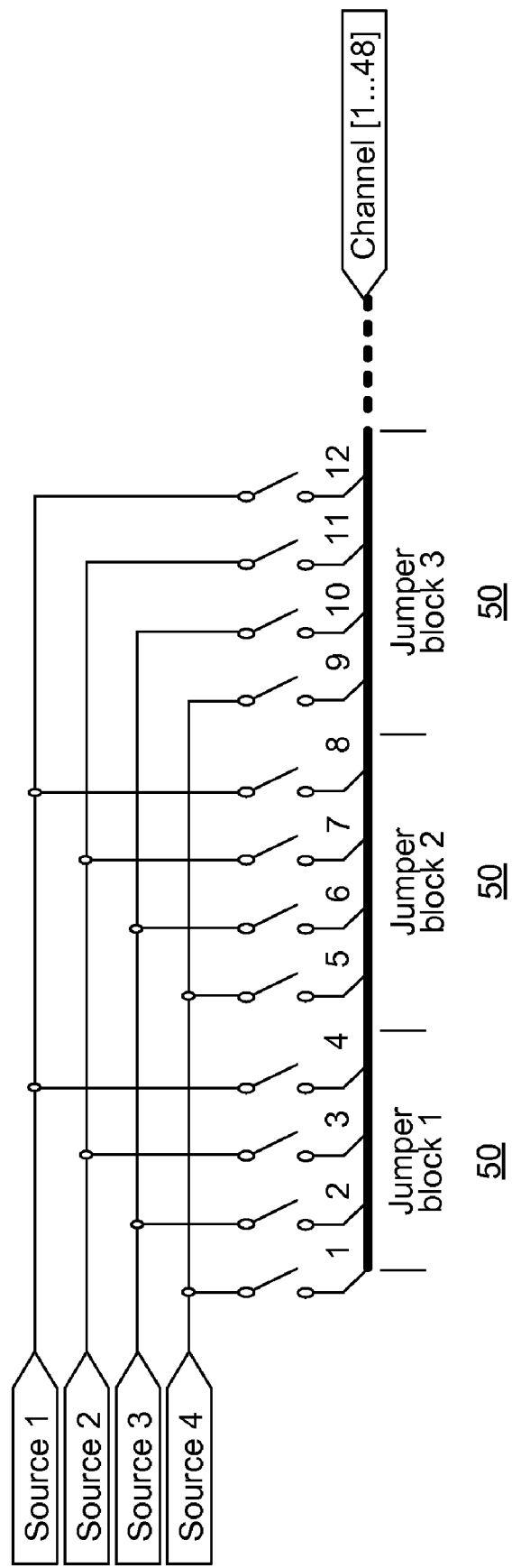
FIG. 3 is a schematic jumper block multiplexing in the system of FIG. 2.
Figure 4:
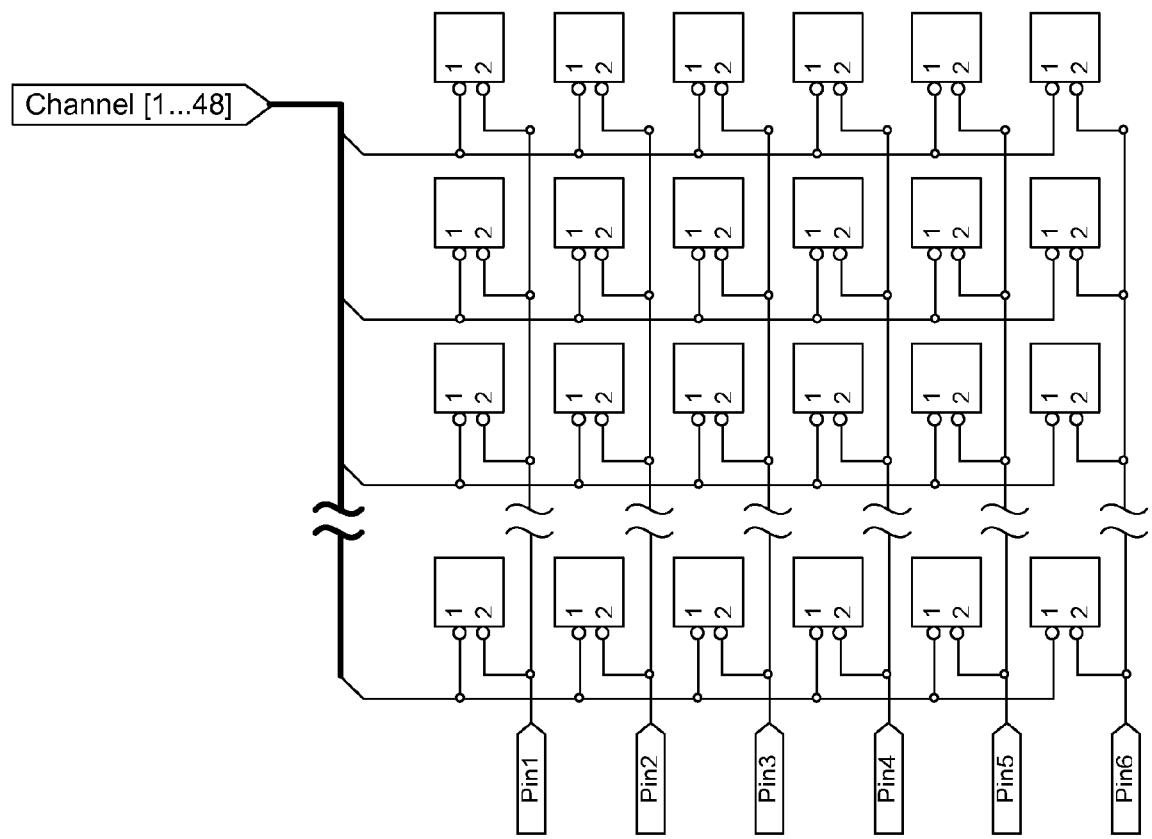
FIG. 4 is a schematic of a jumper card for manually selecting probe pins for connection with channels (sources) of a parametric tester.
Figure 5:
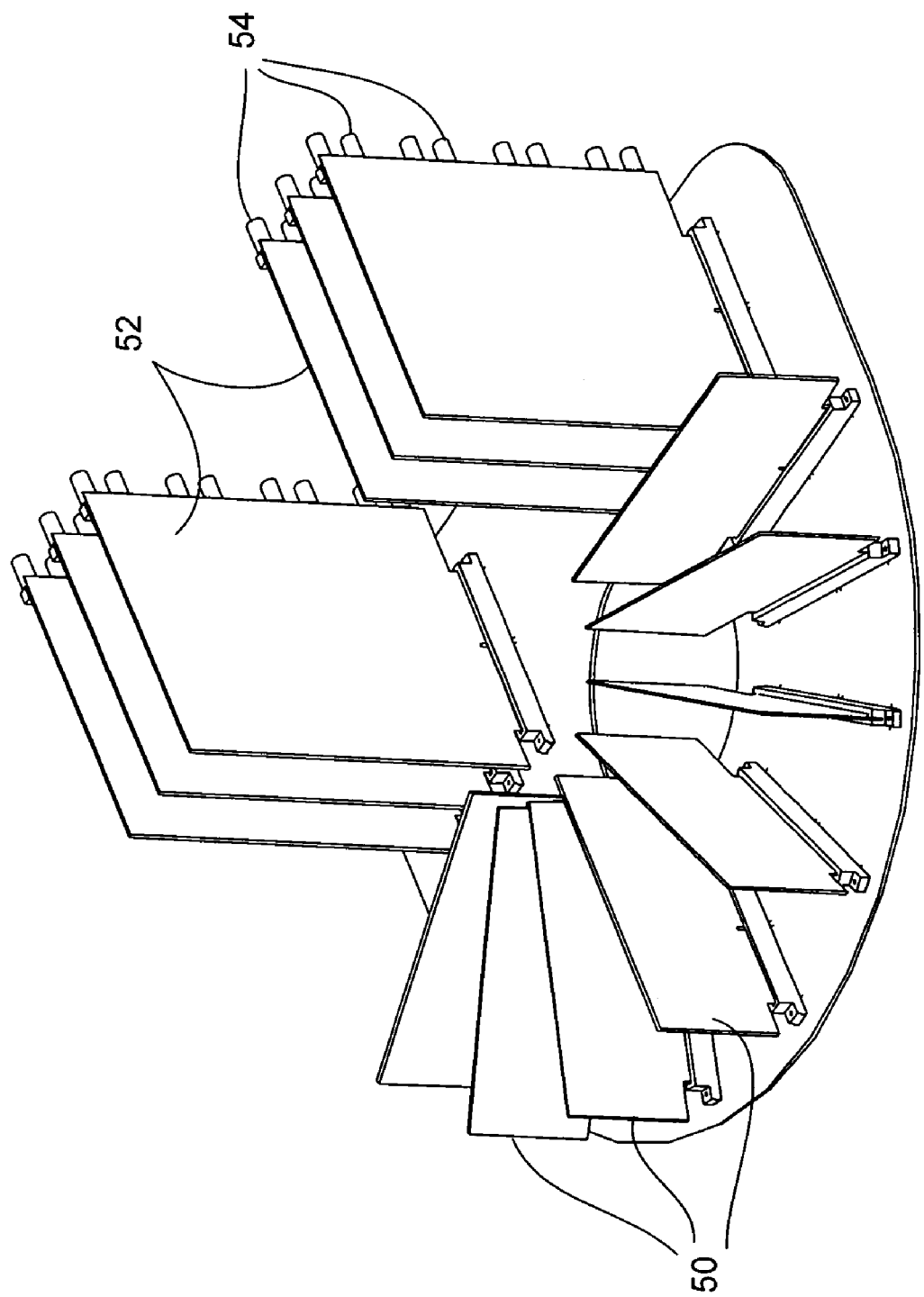
FIG. 5 illustrates an arrangement of multiplexer boards for one embodiment of the invention.

As an example, a four SMU system may get multiplexed into 48 pins of a probecard for up to 12 four terminal devices. The sources are multiplexed into 12×4 internal lines which are common to all the jumper blocks 50 as illustrated in FIG. 3. These jumper blocks, as illustrated in FIG. 4, connect the internal channels to the probe pins. Generally these jumper blocks will be arranged around the backplane, as shown in FIG. 5, to reference groups of pins. All internal channels connect to all groups of jumper blocks, but each group of jumper blocks will connect only to the related pins on the probe card. Therefore, there can be 8 jumper boards or blocks, each of which will have jumper cables for connectivity to six pins, for up to 48 pins, and 12 sets of 4 internal channels to multiplex each of the 4 sources into the 8 jumper boards. Thus, as depicted in FIG. 3, source 4 would be switched into lines 1, 5, 9, 13, etc. Source 3 would be switched into lines 2, 6, 10, 14, etc. In the 4 source embodiment there would only be one relay board in FIG. 5 which would multiplex the 4 sources into these 48 internal lines, running through the backplane, such that the 8 jumper boards can be connected to the 48 lines by jumper cables, 6 on each board. Hence 48 pins would be utilized for 12 four terminal devices. If, however, the devices under test have fewer terminals than 4 or have common terminals then the number of devices that can be multiplexed will increase.

The jumper pins can be arranged in groups of 6 on eight cards for space and size consideration, and this configuration does not limit the scope of possibilities and implementations of the invention.

The backplane connection to the probe card can be through pogo pins attached to the backplane, in the same manner as in conventional multiplexers that are attached on automated wafer probers.

As depicted in FIG. 5, in this embodiment, more than 4 sources can be multiplexed into the internal channels by adding more relays (48 in this case, for each set of 4 sources) to multiplex each of the 4 new sources into all 48 internal channels. In the example depicted in FIG. 5, up to 6 relay boards 52, each with 4 sources 54, can be multiplexed into 48 pins, to test 24 two terminal devices with only 6×48 relays, whereas in the conventional multiplexers the number of relays needed would be 24 sources multiplied by 48 pins, or four times as many.

The use of jumper blocks for manually programming probe connections to a parametric tester for the different devices on a wafer substantially reduces the need for multiplexer switches. The jumper blocks can be economically fabricated printed circuit boards with receptacles for jumper cables.

While the invention has been described with reference to specific embodiments, the description is illustrative of the invention and is not to be construed as limiting the invention. Various applications may occur to those skilled in the art without departing from the spirit and scope of the invention as defined by the appended claims.

What is claimed is:

1. A parametric test system for testing devices in dice in a semiconductor wafer, each die having a plurality of pads for electrically connecting to the device in the die, comprising:
    a) a tester having a plurality of input/output lines for providing and receiving electrical signals during test,
    b) a wafer prober having probe contacts for engaging pads on a die,
    c) a jumper block for each device type in the semiconductor wafer, each jumper block having
    inputs for receiving tester input/output lines,
    a plurality of contacts corresponding to pads of a device to be tested and connected with probe contacts, and
    manually settable connectors for selectively interconnecting jumper block inputs to block contacts, the interconnection such that each jumper block input is manually connectable to any one of the corresponding block contacts and each jumper block input is connected to one and only one block contact, and
    d) a multiplexer comprising a plurality of relays, for selectively connecting tester input/output lines to jumper blocks based on a setting of the relays.

2. The parametric test system of claim 1 wherein the manually set connectors of a jumper block comprise jumper cables.

3. The parametric test system of claim 2 wherein the tester provides N source lines for M different devices, the multiplexer comprising M×N relays.

4. The parametric test system of claim 3 wherein the tester provides four source signals to 12 different devices and the multiplexer comprises 48 relays.

5. The parametric test system of claim 1 wherein the tester provides N source lines for M different devices, the multiplexer comprising M×N relays.

6. A method of multiplexing test signals from a parametric tester to pads of different devices in dice of a semiconductor wafer comprising the steps of:
    a) providing a jumper block for each device, the block including inputs for receiving test signals, block contacts corresponding to probe contacts which engage pads of devices,
    b) connecting block contacts to probe contacts through jumper blocks,
    c) multiplexing test signals to jumper blocks based on a setting of relays of a multiplexer; and
    d) manually setting the connectors to, for each jumper block, interconnect the block contacts of that jumper block such that each jumper block input of that jumper block is manually connectable to one of the corresponding block contacts of that jumper block and each jumper block input of that jumper block is connected to one and only one block contact of that jumper block.

7. The method of claim 6 wherein N test signals are applied to M different devices, and the multiplexing requires M×N relays.

8. The method of claim 7 wherein four source signals are connected to twelve different devices and the multiplexing requires 12 relays.

* * * * *